US010404247B2

(12) United States Patent
Minzoni

(10) Patent No.: US 10,404,247 B2
(45) Date of Patent: Sep. 3, 2019

(54) HIGH-FREQUENCY DELAY-LOCKED LOOP AND CLOCK PROCESSING METHOD FOR SAME

(71) Applicant: XI'AN UNIIC SEMICONDUCTORS CO., LTD., Shaanxi (CN)

(72) Inventor: Alassandro Minzoni, Shaanxi (CN)

(73) Assignee: XI'AN UNIIC SEMICONDUCTORS CO., LTD., Xi'an (CN)

( * ) Notice: Subject to any disclaimer, the term of this patent is extended or adjusted under 35 U.S.C. 154(b) by 0 days.

(21) Appl. No.: 15/515,363

(22) PCT Filed: Sep. 30, 2015

(86) PCT No.: PCT/CN2015/091198
§ 371 (c)(1),
(2) Date: Jul. 5, 2017

(87) PCT Pub. No.: WO2016/050211
PCT Pub. Date: Apr. 7, 2016

(65) Prior Publication Data
US 2017/0366178 A1 Dec. 21, 2017

(30) Foreign Application Priority Data

Sep. 30, 2014 (CN) .......................... 2014 1 0522694

(51) Int. Cl.
H03K 7/08 (2006.01)
H03L 7/081 (2006.01)
H03L 7/08 (2006.01)

(52) U.S. Cl.
CPC ............... H03K 7/08 (2013.01); H03L 7/08 (2013.01); H03L 7/0812 (2013.01)

(58) Field of Classification Search
CPC ...... H03K 7/08; H03K 5/1565; H03K 3/0315; H03K 5/131; H03K 5/135; H03K 7/04;
(Continued)

(56) References Cited

U.S. PATENT DOCUMENTS 7,250,802 B2 * 7/2007 Lin ...................... H03K 5/1565
327/170
2007/0176657 A1 * 8/2007 Byun ...................... H03K 5/13
327/158
(Continued)

FOREIGN PATENT DOCUMENTS

CN 101087132 A 12/2007
CN 102055436 A 5/2011
(Continued)

OTHER PUBLICATIONS

International Search Report and Written Opinion dated Jan. 5, 2016 for application PCT/CN2015/091198, filed on Sep. 30, 2015 and published as WO 2016/050211 on Apr. 7, 2016 (Applicant—Shandong Sinochip Semiconductors Co., Ltd.) (Translation Only—9 pages).
(Continued)

Primary Examiner — John W Poos
(74) Attorney, Agent, or Firm — Ballard Spahr LLP

(57) ABSTRACT

The present invention provides a high-frequency delay-locked loop and a clock processing method for the high-frequency delay-locked loop. The high-frequency delay-locked loop comprises a DLL circuit and a DCC circuit that are sequentially connected in series, and a pulse generating circuit used for generating a clock having a fixed pulse width. The fixed pulse width is a high-level width of the clock having the fixed pulse width and not smaller than a minimum pulse width required by the DLL circuit. The fixed pulse width enables a low-level width of the clock having the fixed pulse width to be not smaller than the minimum pulse width required by the DLL circuit. The clock having the fixed pulse width is input into the DLL circuit.

16 Claims, 2 Drawing Sheets

(58) Field of Classification Search
CPC ... H03K 5/06; H03K 5/15; H03L 7/08; H03L 7/70812
USPC .................................. 327/156, 158, 161
See application file for complete search history.

(56) References Cited

U.S. PATENT DOCUMENTS

| | | | |
|---|---|---|---|
| 2009/0009228 A1* | 1/2009 | Jang | G06F 1/08 327/295 |
| 2010/0091591 A1 | 4/2010 | Byun | |
| 2011/0102039 A1 | 5/2011 | Shin | |
| 2011/0221495 A1* | 9/2011 | Lee | H03K 5/1565 327/158 |
| 2011/0234278 A1* | 9/2011 | Seo | H03L 7/0814 327/158 |
| 2012/0105119 A1* | 5/2012 | Kim | H03L 7/0816 327/158 |

FOREIGN PATENT DOCUMENTS

| | | |
|---|---|---|
| CN | 102347767 A | 2/2012 |
| CN | 102638246 A | 8/2012 |
| CN | 103546151 A | 1/2014 |
| CN | 104242921 A | 12/2014 |
| CN | 104283550 A | 1/2015 |
| CN | 204119209 U | 1/2015 |

OTHER PUBLICATIONS

International Preliminary Report on Patentability dated Apr. 4, 2017 for application PCT/CN2015/091198, filed on Sep. 30, 2015 and published as WO 2016/050211 on Apr. 7, 2016 (Applicant—Shandong Sinochip Semiconductors Co., Ltd.) (5 pages).

* cited by examiner

HIGH-FREQUENCY DELAY-LOCKED LOOP AND CLOCK PROCESSING METHOD FOR SAME

CROSS-REFERENCE TO RELATED APPLICATIONS

The present application is a U.S. National Phase Application of International Application No. PCT/CN2015/091198, filed Sep. 30, 2015, which claims priority to Chinese Application No. 201410522694.5, filed Sep. 30, 2014, each of which are hereby incorporated by reference in their entirety.

TECHNICAL FIELD

The present invention relates to a delay-locked loop, and more particularly relates to a high-frequency delay-locked loop and a clock processing method for the high-frequency delay-locked loop.

BACKGROUND ART

The delay-locked loop (DLL) technology, which is achieved by improving the PLL technology, is widely applied in the timing field. The DLL has inherited the phase lock technology for PLL circuit, but removed the oscillator section within the PLL circuit, which is replaced by a delay line whose delay amount can be controlled. Compared with the PLL, the DLL has no jitter accumulation, but has a shorter locking time and the advantage that the loop filter can be easily integrated and so on.

A clock Duty Cycle Corrector (DCC) circuit is used for adjusting the duty cycle of a signal. The DCC can be used together with the DLL, thereby the duty cycle of an output signal can be adjusted to 50%.

FIG. 1 is a schematic diagram of the circuit structure of a high-frequency delay-locked loop in the prior art, wherein the high-frequency delay-locked loop is implemented by a DLL/DCC circuit structure. The operation principle of the DLL is that an input clock is delayed via a DLL delay chain to form a first clock (clock_000), the first clock (clock_000) is delayed via a first DCC delay chain (DCC delay chain 1) to form a second clock (clock_180), and the second clock (clock_180) is delayed via a second DCC delay chain (DCC delay chain 2) to form a third clock (clock_360). The DCC delay chain 1 and the DCC delay chain 2 are the same. The second clock (clock_180) has a phase delay of 180° relative to the first clock (clock_000), and the third clock (clock_360) has a phase delay of 180° relative to the second clock (clock_180). A feedback clock is formed after the first clock (clock_000) and the second clock (clock_180) pass through a clock combining circuit in the DCC circuit and a feedback circuit, and the phase of the input clock is compared with the phase of the feedback clock in a DLL phase detector. The DLL phase detector controls a DLL logic control circuit based on the comparison result, so that the DLL logic control circuit controls the DLL delay chain to increase or decrease the delay length thereof until the phase of the input clock is aligned with the phase of the feedback clock.

As to the DCC circuit, as described above, the first clock (clock_000) is input into the DCC, and the second clock (clock_180) and the third clock (clock_360) are generated after the first clock passes through two identical delay chains, i.e. the DCC delay chain 1 and the DCC delay chain 2. The phase of the first clock (clock_000) is compared with the phase of the third clock (clock_360) in the DCC phase detector, which controls the DCC logic control circuit based on the phase comparison result, so that the DCC logic control circuit controls the DCC delay chain 1 and the DCC delay chain 2 to increase or decrease the delay length thereof respectively until the phase of the first clock (clock_000) is aligned with the phase of the third clock (clock_360).

FIG. 2 is a timing control diagram of the operation principle of the DCC in the high-frequency delay-locked loop of FIG. 1. As shown in FIG. 2, when the DCC is locked, the rising edge of the first clock (clock_000) is aligned with the rising edge of the third clock (clock_360). Since the DCC delay chain 1 and the DCC delay chain 2 are completely the same, the delay between the rising edge of the second clock (clock_180) and the rising edge of the first clock (clock_000) is exactly half of the clock period. The first clock (clock_000) and the second clock (clock_180) are input into the clock combining circuit, wherein the rising edge of the first clock (clock_000) generates the rising edge of the output clock and the rising edge of the second clock (clock_180) generates the falling edge of the output clock. Thus the duty cycle of the output clock is 50%, i.e. the correction to the duty cycle of the clock is achieved.

In the prior art, the following problems exist in the DLL/DCC circuit structure as described above: although the DLL/DCC circuit of such structure can guarantee the phase and the duty cycle (50%) of the output clock, for example, when the input clock has a very high frequency and a very small duty cycle (for example, the input clock has a clock period TCK=1 ns, a duty cycle of 30%, and a high level width of 300 ps), the input clock will be lost after passing through the DLL delay chain, the DCC delay chain 1 and the DCC delay chain 2 due to duty cycle distortion of the clock delay chains, resulting in an error in the output clock. That is, after the clock with a high level of 300 ps is delayed, the high level will disappear and a predetermined output clock cannot be obtained. Similarly, if the low level width of the input clock is too small, the low level will disappear after the input clock passes through the DLL delay chain, the DCC delay chain 1 and the DCC delay chain 2 and a predetermined output clock cannot be obtained either.

SUMMARY OF THE INVENTION

In view of the problems existing in the prior art, the present invention provides a high-frequency delay-locked loop that can ensure that a clock signal is stable and does not disappear even for a clock signal having a high-frequency and a small receivable duty cycle, and a clock processing method for same.

The present invention is implemented by the technical solution as follows:

The present invention provides a high-frequency delay-locked loop, comprising a DLL circuit and a DCC circuit which are sequentially connected in series, and a pulse generating circuit used for generating a clock having a fixed pulse width, the fixed pulse width being a high level width of the clock having the fixed pulse width and not smaller than a minimum pulse width required by the DLL circuit, and the fixed pulse width enabling a low level width of the clock having the fixed pulse width to be not smaller than the minimum pulse width required by the DLL circuit, wherein the clock having the fixed pulse width is input into the DLL circuit.

Preferably, an input clock is delayed by a fixed delay to generate a delayed input clock via the pulse generating circuit, with the rising edge of the input clock generating the rising edge of the clock having the fixed pulse width and the rising edge of the delayed input clock generating the falling edge of the clock having the fixed pulse width.

Preferably, the fixed delay is determined by the DLL circuit and the DCC circuit.

Preferably, the pulse generating circuit is a clock combining circuit.

Preferably, the DCC circuit comprises a first DCC delay chain and a second DCC delay chain that are sequentially connected in series, and a DCC phase detector, a DCC Logic control circuit and a clock combining circuit; wherein the first DCC delay chain and the second DCC delay chain are the same; wherein the first clock is delayed via the first DCC delay chain to form a second clock, and the second clock is delayed via the second DCC delay chain to form a third clock; wherein the first clock and the second clock are input into the clock combining circuit to generate an output clock; wherein the DCC phase detector compares the phase of the first clock and the phase of the third clock, and the DCC logic control circuit controls the first DCC delay chain and the second DCC delay chain based on the comparison result of the DCC phase detector, so that the phase of the first clock is aligned with the phase of the third clock.

Preferably, the rising edge of the first clock generates the rising edge of the output clock, and the rising edge of the second clock generates the falling edge of the output clock.

Further, the DLL circuit comprises a DLL delay chain, a DLL phase detector, a DLL logic control circuit and a feedback circuit; wherein the first clock is generated by the DLL delay chain; wherein a feedback clock is formed after the output clock passes through the feedback circuit; wherein the DLL phase detector compares the phase of the clock having the fixed pulse width and the phase of the feedback clock; and wherein the DLL logic control circuit controls the DLL delay chain based on the comparison result of the DLL phase detector, so that the phase of the clock having the fixed pulse width is aligned with the phase of the feedback clock.

The present invention also provides a clock processing method for a high-frequency delay-locked loop, wherein the high-frequency delay-locked loop comprises a DLL circuit and a DCC circuit that are sequentially connected in series, characterized in that the clock processing method comprises using a pulse generating circuit to generate a clock having a fixed pulse width, wherein the fixed pulse width is a high level width of the clock having the fixed pulse width and not smaller than the minimum pulse width required by the DLL circuit, wherein the fixed pulse width enables a low level width of the clock having the fixed pulse width to be not smaller than a minimum pulse width required by the DLL circuit, wherein the clock having the fixed pulse width is input into the input of the DLL circuit, and wherein the pulse generating circuit generating the clock having the fixed pulse width comprises generating a delayed input clock after the input clock is delayed by a fixed delay, with the rising edge of the input clock generating the rising edge of the clock having the fixed pulse width and the rising edge of the delayed input clock generating the falling edge of the clock having the fixed pulse width.

Compared with the prior art, the present invention has the following advantageous technical effects:

The present invention adjusts the pulse width of the input clock to a fixed pulse width by providing the pulse generating circuit, so that the input clock has enough pulse width during transmission without causing the disappearance of signal due to the distortion, guaranteeing that the clock signal is not lost when transmitted in the DLL delay chain and the DCC delay chain. Meanwhile, because only the width of the pulse signal is changed but the period and the phase are not changed, the interference with the signal and the damage to the signal are avoided, and the stability and reliability of signal transmission are ensured while the transmission quality is improved. The present invention can be used widely.

Further, by making the input clock delayed, the rising edge and falling edge of the fixed pulse width are generated by using the pulses of the input clock itself, and thus the width of the fixed pulse can be controlled by only controlling the delay time without introducing an external signal, making the circuit structure simple.

Further, with the specific limitations on the DLL/DCC circuit, the input clock signal is delayed and the duty cycle is adjusted to provide a stable signal source for subsequent use of the output clock.

DETAILED DESCRIPTION

The present invention will further be described in details with reference to specific examples, and it is to be understood that the following description is intended to be illustrative of the invention and not to limit the invention.

Figure 1:
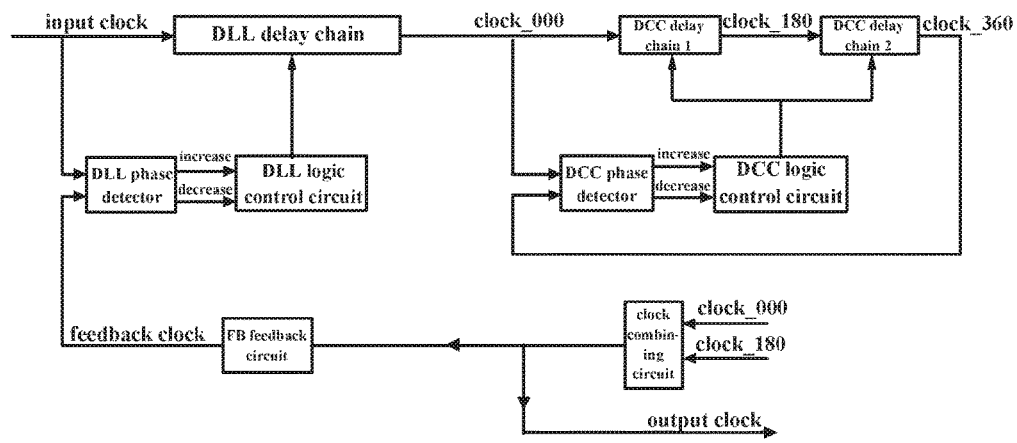
FIG. 1 is a schematic diagram of a circuit structure of a high-frequency delay-locked loop in the prior art.
Figure 2:
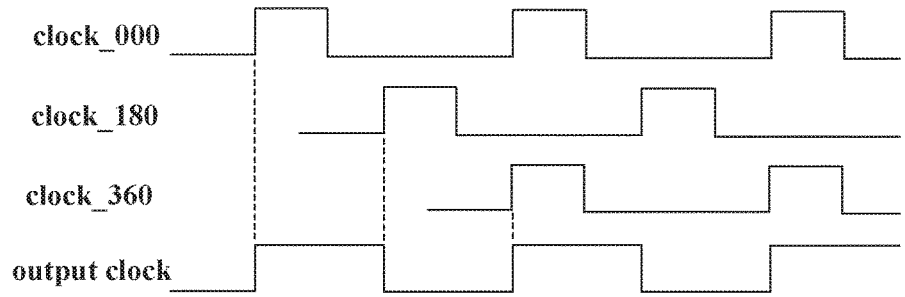
FIG. 2 is a timing control diagram of the operation principle of the DCC in the high-frequency delay-locked loop of FIG. 1.
Figure 3:
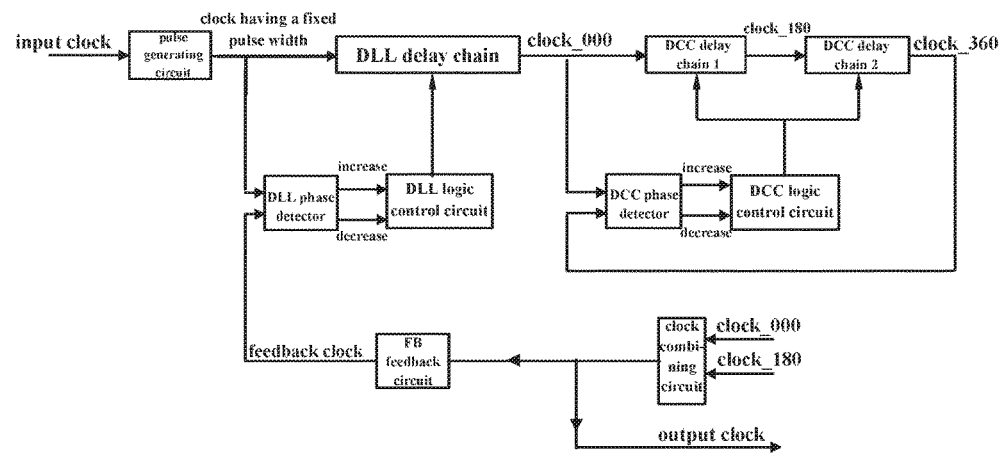
FIG. 3 shows a schematic diagram of a high-frequency delay-locked loop circuit structure according to one embodiment of the present invention.

FIG. 3 shows a schematic diagram of a high-frequency delay-locked loop circuit structure according to one embodiment of the present invention. As shown in FIG. 3, the high-frequency delay-locked loop circuit includes a DLL circuit and a DCC circuit that are sequentially connected in series, and a pulse generating circuit; an input clock accesses the input of the DLL circuit via the pulse generating circuit; the pulse generating circuit is used for generating a clock having a fixed pulse width, the fixed pulse width is not smaller than the minimum pulse width required by the DLL circuit and the clock having the fixed pulse width is input into the DLL circuit. The operation principle of the pulse generating circuit will be described below with reference to FIG. 4.

Figure 4:
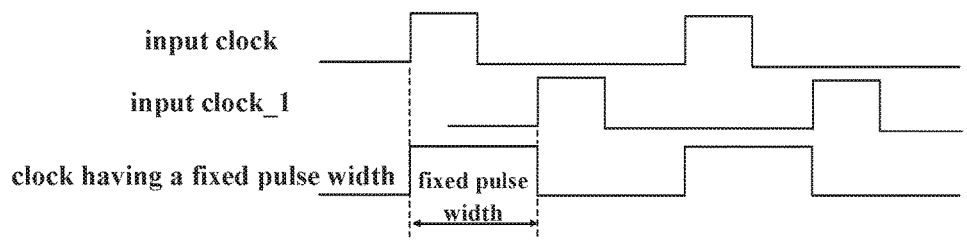
FIG. 4 shows a timing diagram for generating a fixed pulse width by a clock processing method according to one embodiment of the present invention.

FIG. 4 shows a timing diagram for generating a fixed pulse width by a clock processing method according to one embodiment of the present invention. As shown in FIG. 4, the input clock is delayed by a fixed delay to form a delayed input clock (input clock_1) via the pulse generating circuit, the rising edge of the input clock generates the rising edge of the clock having the fixed pulse width, and the rising edge of the delayed input clock (input clock_1) generates the falling edge of the clock having the fixed pulse width. The delay time of the input clock can ensure that a pulse having a fixed width is not lost when transmitted in the DLL delay chain and the DCC delay chain; the delay time of the input clock is the pulse width of the clock having the fixed pulse width, and thus it is possible to achieve rapid adaptability adjustment of the fixed pulse width by controlling the delay time in an easy and quick manner. The structure of the circuit is extremely simple, and the operation is extremely convenient.

Specifically, as shown in FIG. 3, the DCC circuit includes a first DCC delay chain and a second DCC delay chain that are sequentially connected in series, a DCC phase detector, a DCC logic control circuit, and a clock combining circuit. The first DCC delay chain and the second DCC delay chain are the same. The input clock is input into the pulse generating circuit to form the clock having the fixed pulse width. The clock having the fixed pulse width is delayed via the DLL delay chain to form a first clock (clock_000), the first clock (clock_000) is delayed via the first DCC delay chain to form a second clock (clock_180), and the second clock (clock_180) is delayed via the second DCC delay chain to form a third clock (clock_360); the first clock (clock_000) and the second clock (clock_180) both are input into the clock combining circuit, which generates an output clock based on the first clock (clock_000) and the second clock (clock_180), wherein the rising edge of the first clock (clock_000) is the rising edge of the output clock, and the rising edge of the second clock (clock_180) is the falling edge of the output clock. The DCC phase detector is used for comparing the phase of the first clock (clock_000) with the phase of the third clock (clock_360), and the DCC logic control circuit controls the corresponding clock signal, i.e. the second clock (clock_180) and the third clock (clock_360), produced by the first DCC delay chain and the second DCC delay chain respectively based on the comparison result of the DCC phase detector, so that the phase of the first clock (clock_000) is aligned with the phase of the third clock (clock_360). In addition, the DLL circuit includes a DLL delay chain, a DLL phase detector, a DLL logic control circuit and a feedback circuit FB. The pulse having the fixed width is delayed via the DLL delay chain to form the first clock (clock_000); the output clock is input into the feedback circuit FB, which outputs a feedback clock; the DLL phase detector compares the phase of the pulse having the fixed width and the phase of the feedback clock; and the DLL logic control circuit controls the first clock (clock_000) produced by the DLL delay chain based on the comparison result of the DLL phase detector, so that the phase of the clock having the fixed pulse width is aligned with the phase of the feedback clock.

The invention also provides a clock processing method for a high-frequency delay-locked loop. As shown in FIG. 4, the input clock which otherwise would be directly input into the DLL circuit is processed to have a fixed pulse width, and then the clock having the fixed pulse width is processed by the DLL circuit and the DCC circuit sequentially to obtain an output clock. The process of the pulse generating circuit making input clock having a fixed pulse width is as follows: the input clock first is delayed by a fixed delay to generate a delayed input clock (input clock_1), and the rising edge of the input clock generates the rising edge of the clock having the fixed pulse width and the rising edge of the delayed input clock (input clock_1) generating the falling edge of the clock having the fixed pulse width, so as to obtain the clock having the fixed pulse width. The fixed pulse width is not smaller than the minimum pulse width required by the DLL circuit. As the clock signal may suffer from duty cycle distortion when transmitted in the DLL delay chain, if the pulse width of the input clock is very narrow, the input clock will be lost when transmitted in the DLL delay chain. Assuming that the clock will be lost if the pulse width is smaller than H, that is, the minimum pulse width is H, the fixed pulse width produced by the pulse generating circuit must be not smaller than H. It will be appreciated that this minimum pulse width H is the minimum pulse width required by the DLL circuit, i.e. both the high level width and the low level width of the pulse input into the DLL cannot be smaller than the minimum pulse width. In this context, the value of the fixed pulse width refers to the width of the high level of the clock having the fixed pulse width. For example, when the period of the input clock is 1 ns and the minimum pulse width H is required to be 400 ps, the fixed pulse width is in the range of 400 ps to 600 ps to ensure that both the high level width and the low level width of the clock input into the DLL circuit are above the minimum pulse width required by the DLL circuit. The specific value of the adopted fixed pulse width is set according to the DLL and DCC, and the fixed pulse width can be set manually.

Therefore, even if the pulse width of the input clock is very small (for example, 300 ps), the pulse of the clock which has passed through the pulse generating circuit has a fixed width (for example, 500 ps, which is equal to the delay between the input clock and the input clock_1). The clock having this fixed pulse width does not disappear after passing through the delay chain, and in turn does not produce distortion, thereby expanding its application range and the frequency range of the input clock signal to be adapted.

It is to be understood that any improvements, variations or modifications to the invention are intended to be included within the scope of the claims appended hereto without departing from the spirit of the invention.

The invention claimed is:

1. A high-frequency delay-locked loop comprising:
  a delay-locked loop (DLL) circuit and a duty cycle corrector (DCC) connected in series; and
  a pulse generating circuit comprising a clock combining circuit, wherein the pulse generating circuit is configured to generate a fixed pulse width clock signal as an input to the DLL circuit, wherein the fixed pulse width comprises a high level width that is at least a minimum pulse width required by the DLL circuit.

2. The high-frequency delay-locked loop of claim 1, wherein the pulse generating circuit is further configured to generate a delayed input clock signal by delaying an input clock signal by a fixed delay to produce a delayed clock signal, wherein the fixed pulse width clock signal has a rising edge that corresponds to a rising edge of the input clock signal and the fixed pulse width clock signal has a trailing edge that corresponds to a rising edge of the delayed clock signal.

3. The high-frequency delay-locked loop of claim 2, wherein the fixed delay is determined by one or more of the DLL circuit or the DCC circuit.

4. The high-frequency delay-locked loop of claim 1, wherein an output signal of the DCC comprises a fifty percent duty cycle.

5. The high-frequency delay-locked loop of claim 1, wherein the DCC circuit comprises a first DCC delay chain and a second DCC delay chain that are connected in series, a DCC phase detector, a DCC Logic control circuit, and a clock combining circuit; wherein the first DCC delay chain and the second DCC delay chain are configured the same; wherein a first clock signal is delayed via the first DCC delay chain to form a second clock signal, and the second clock signal is delayed via the second DCC delay chain to form a third clock signal; wherein the first clock signal and the second clock signal are input into the second clock combining circuit to generate an output clock signal; wherein the DCC phase detector is configured to compare a phase of the first clock signal and a phase of the third clock signal, wherein the DCC logic control circuit, based on the comparison of the phase of the first clock signal and the phase of the third clock signal, is configured to align the phase of the first clock signal with the phase of the third clock signal.

6. The high-frequency delay-locked loop of claim 5, wherein a rising edge of the first clock signal corresponds to a rising edge of the output clock signal, and a rising edge of the second clock signal corresponds to a trailing edge of the output clock signal.

7. The high-frequency delay-locked loop of claim 5, wherein the DLL circuit comprises a DLL delay chain, a DLL phase detector, a DLL logic control circuit and a feedback circuit, wherein the first clock is generated by the DLL delay chain, wherein a feedback clock is formed after the output clock passes through the feedback circuit; wherein the DLL phase detector compares a phase of the fixed pulse width clock signal and a phase of the feedback clock; and wherein the DLL logic control circuit controls the DLL delay chain based on the comparison result of the DLL phase detector, so that the phase of the fixed pulse width clock signal is aligned with the phase of the feedback clock signal.

8. A clock processing method for a high-frequency delay-locked loop, wherein the high-frequency delay-locked loop comprises a DLL circuit and a DCC circuit that are connected in series, wherein the clock processing method comprises:
generating, via the pulse generating circuit a clock signal comprising a fixed pulse width, wherein the fixed pulse width is a high level width of the clock signal and at least a minimum pulse width required by the DLL circuit, wherein the clock signal is an input signal for the DLL circuit, wherein the pulse generating circuit is configured to generate the clock signal by delaying an input clock signal by a fixed delay, wherein a rising edge of the clock signal corresponds to a rising edge of the input clock signal and a trailing edge of the clock signal corresponds to a rising edge of the delayed input clock signal.

9. A high-frequency delay-locked loop comprising:
a delay-locked loop (DLL) circuit and a duty cycle corrector (DCC) circuit connected in series; and
a pulse generating circuit comprising a clock combining circuit, wherein the pulse generating circuit is configured to generate a fixed pulse width clock signal as an input to the DLL circuit, wherein the fixed pulse width comprises a high level width and a low level width of the fixed pulse width clock signal that are each at least a minimum pulse width required by the DLL circuit.

10. The high-frequency delay-locked loop of claim 9, wherein the pulse generating circuit is further configured to generate a delayed input clock signal by delaying an input clock signal by a fixed delay, wherein a rising edge of the input clock signal corresponds to a rising edge of the fixed pulse width clock signal and a rising edge of the delayed input clock signal corresponds to a trailing edge of the fixed pulse width clock signal.

11. The high-frequency delay-locked loop of claim 10, wherein the fixed delay is determined by one or more of the DLL circuit or the DCC circuit.

12. The high-frequency delay-locked loop of claim 9, wherein an output signal of the DCC comprises a fifty percent duty cycle.

13. The high-frequency delay-locked loop of claim 10, wherein the DCC circuit comprises a first DCC delay chain and a second DCC delay chain connected in series, a DCC phase detector, a DCC Logic control circuit, and a clock combining circuit; wherein the first DCC delay chain and the second DCC delay chain are configured the same; wherein the first clock signal is delayed via the first DCC delay chain to form a second clock signal, and the second clock signal is delayed via the second DCC delay chain to form a third clock; wherein the clock combining circuit is configured to combine the first clock signal and the second clock signal to generate an output clock signal; wherein the DCC phase detector is configured to compare a phase of the first clock signal with a phase of the third clock signal, and the DCC logic control circuit, based on the comparison of the phase of the first clock signal and the phase of the third clock signal, is configured to align the phase of the first clock signal with the phase of the third clock signal.

14. The high-frequency delay-locked loop of claim 13, wherein a rising edge of the first clock signal corresponds to a rising edge of the output clock signal, and a rising edge of the second clock signal corresponds to a trailing edge of the output clock signal.

15. The high-frequency delay-locked loop of claim 13, wherein the DLL circuit comprises a DLL delay chain, a DLL phase detector, a DLL logic control circuit, and a feedback circuit; wherein the first clock signal is generated by the DLL delay chain, wherein a feedback clock signal is formed after the output clock passes through the feedback circuit, wherein the DLL phase detector is configured to compare a phase of the fixed pulse width clock signal and a phase of the feedback clock and wherein the DLL logic control circuit controls the DLL delay chain, based on the comparison result of the DLL phase detector, so that the phase of the fixed pulse width clock signal is aligned with the phase of the feedback clock.

16. A clock processing method for a high-frequency delay-locked loop, wherein the high-frequency delay-locked loop comprises a DLL circuit and a DCC circuit connected in series, wherein the clock processing method comprises:
generating, via a pulse generating circuit a fixed pulse width clock signal, wherein the fixed pulse width is a high level width of the clock signal and at least a minimum pulse width required by the DLL circuit, wherein the fixed pulse width enables a low level width of the clock signal to be at least a minimum pulse width required by the DLL circuit, wherein the fixed pulse width clock signal is input into an input of the DLL circuit, wherein the pulse generating circuit is configured to generate a delayed input clock signal after an input clock signal is delayed by a fixed delay, wherein a rising edge of the input clock signal corresponds to a rising edge of the fixed pulse width clock signal and a rising edge of the delayed input clock signal corresponds to a trailing edge of the fixed pulse width clock signal.

* * * * *